(12) United States Patent
Liljevik et al.

(10) Patent No.: US 6,787,696 B2
(45) Date of Patent: Sep. 7, 2004

(54) SHIELDED HOUSING

(75) Inventors: Tord Liljevik, Bromma (SE); Dan Karlsson, Solna (SE)

(73) Assignee: Allgon AB, Taby (SE)

( * ) Notice: Subject to any disclaimer, the term of this patent is extended or adjusted under 35 U.S.C. 154(b) by 0 days.

(21) Appl. No.: 10/399,789

(22) PCT Filed: Sep. 12, 2001

(86) PCT No.: PCT/SE01/01952
§ 371 (c)(1),
(2), (4) Date: Sep. 8, 2003

(87) PCT Pub. No.: WO02/35902
PCT Pub. Date: May 2, 2002

(65) Prior Publication Data
US 2004/0036388 A1 Feb. 26, 2004

(30) Foreign Application Priority Data
Oct. 27, 2000 (SE) ................................................ 0003930

(51) Int. Cl.[7] .............................................. H05K 9/00
(52) U.S. Cl. ...................... 174/35 R; 361/816; 361/818
(58) Field of Search ........................ 174/35 R, 35 GC;
361/748, 752, 753, 759, 799, 800, 816,
818, 736, 737

(56) References Cited

U.S. PATENT DOCUMENTS

| | | | |
|---|---|---|---|
| 5,339,222 A | 8/1994 | Simmons et al. | 361/818 |
| 5,477,426 A | 12/1995 | Bethurum | 361/737 |
| 5,846,092 A | * 12/1998 | Feldman et al. | 439/76.1 |
| 5,895,884 A | 4/1999 | Davidson | 174/35 |
| 6,008,994 A | 12/1999 | Bates | 361/737 |
| 6,108,209 A | * 8/2000 | Cox et al. | 361/737 |
| 6,181,573 B1 | * 1/2001 | Riet | 361/816 |
| 6,628,524 B1 | * 9/2003 | Washino et al. | 361/737 |

FOREIGN PATENT DOCUMENTS

EP        0738007 A2    10/1996

* cited by examiner

Primary Examiner—Dean A. Reichard
Assistant Examiner—Carmelo Oliva
(74) Attorney, Agent, or Firm—Jacobson Holman PLLC

(57) ABSTRACT

A shielded housing of electrically conducting material for use in various electromagnetic applications. The housing comprises an upper part (10) and a lower part (20), each part having two side flanges (12, 13, 22, 23). When the housing is assembled, one of the pairs of side flanges fits resiliently inside the other pair, and the mutually contacting side flanges exert a surface contact pressure against each other, so as to jointly form sidewalls of the housing.

8 Claims, 2 Drawing Sheets

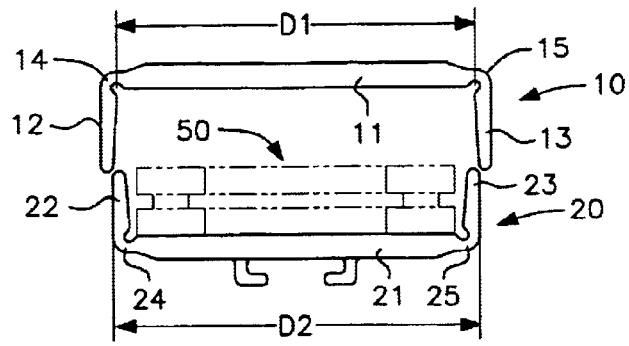
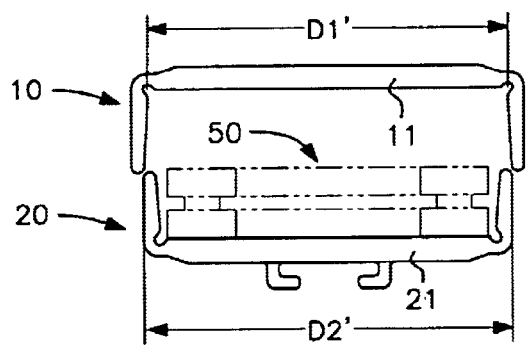 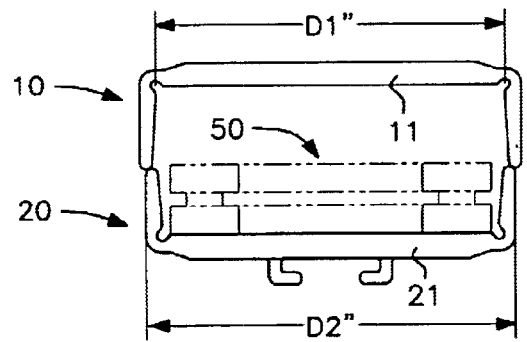
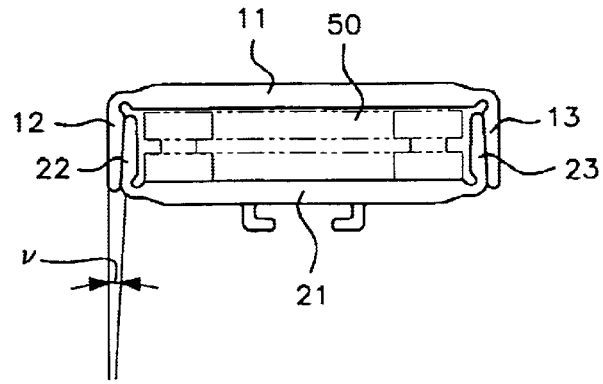

ion flange. In any case, it is often a problem to assemble the two
SHIELDED HOUSING This is a nationalization of PCT/SE01/01952 filed Sep. 12, 2001 and published in English.

FIELD OF THE INVENTION

The invention relates to a shielded housing for use in various high frequency electromagnetic applications, e.g. a shielded housing for a strip line or microstrip transmission device, a waveguide or some other device with a housing which constitutes the RF ground. The housing is of the kind substantially consisting of an electrically conducting material and having a top wall, a bottom wall and two side walls serving as a ground plane, at least for RF frequencies, said housing comprising an upper part and a lower part being fitted together, and possibly further parts, such as end walls or the like.

BACKGROUND OF THE INVENTION

It is commonplace to form a housing of two parts, such as a unitary box-like lower part with bottom and side walls, and a top wall in the form of a lid. Sometimes the lid is fitted into a seat in the form of recesses in the upper portions of the side walls, or the lid is provided with a downwardly extending flange. In any case, it is often a problem to assemble the two parts in such a way that a good direct DC connection or a well-defined capacitive coupling is obtained between the two parts, without causing inter-modulation products or other disturbing effects. Conventional methods of joining the two parts are soldering or mechanically joining the two part by a plurality of fasteners, such as rivets or screws. These methods are generally cumbersome and expensive.

SUMMARY OF THE INVENTION

The main object of the present invention is to provide a shielded housing which can be assembled easily and at low cost while securing a well-defined coupling between the two parts.

This object is achieved for a shielded housing having the features defined in claim 1. Accordingly, an upper part with two side flanges is fitted together with a lower part likewise having two side flanges in such a way that the two pairs of side flanges resiliently make a surface contact with each other. In this way, a well-defined coupling is secured.

Preferably, the two parts are made of a metallic material coated with an electrically insulating material, e.g. aluminium with an oxide layer formed in an anodising process.

These and other advantageous features are stated in the dependent claims and will be apparent from the description below.

The invention will be explained more fully below with reference to the drawings illustrating a preferred embodiment.

BRIEF DESCRIPTION OF THE DRAWINGS

FIG. 3 shows a cross-section through the upper and lower housing parts having nominal measures, before assembly;

FIGS. 4 and 5 show similar cross-sections as in FIG. 3, where the upper and lower parts have measures deviating from the nominal values, and FIG. 6 shows a cross-section through the upper and lower housing parts upon being assembled.

DETAILED DESCRIPTION OF A PREFERRED EMBODIMENT

Figure 1:
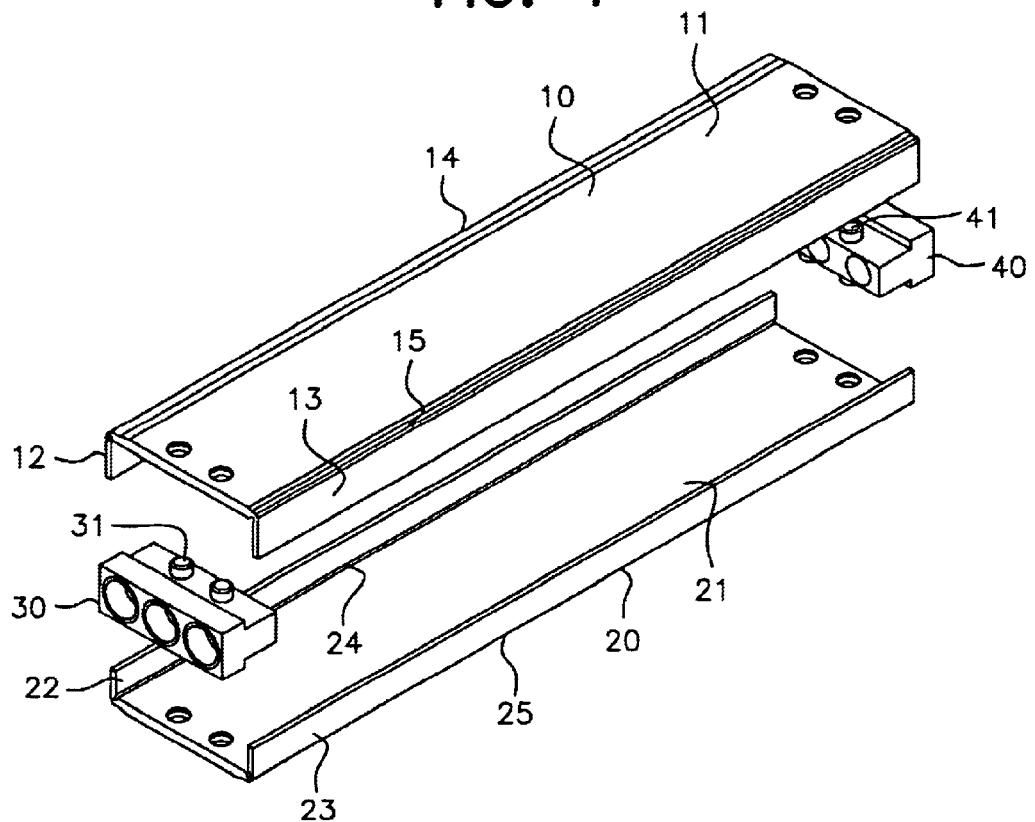
FIG. 1 shows, in a perspective, explosive view, the basic parts of a housing according to the invention.
Figure 2:
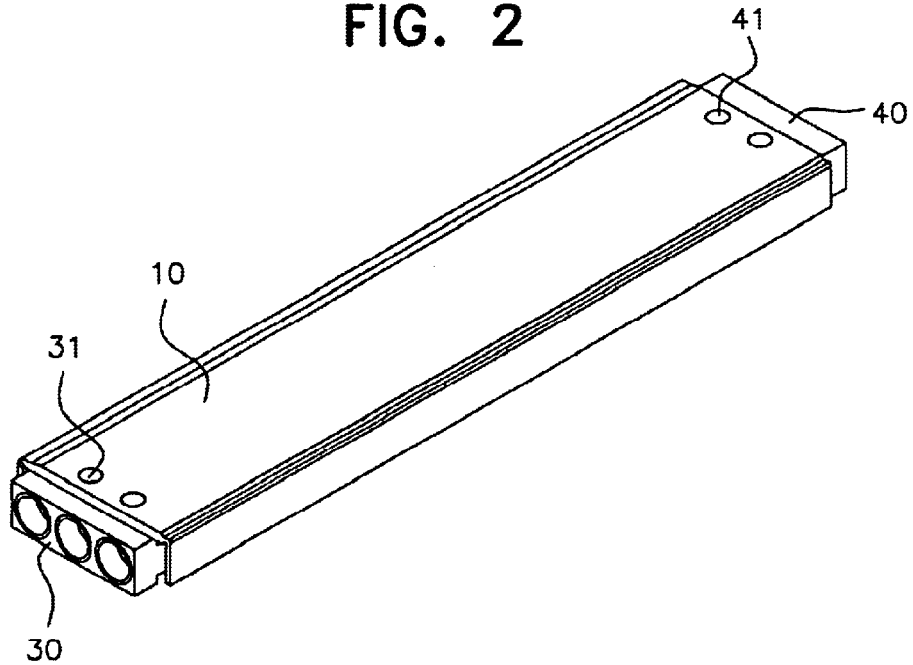
FIG. 2 shows, likewise in a perspective view, the housing of FIG. 1 upon assembly.

In FIG. 1 there are shown upper and lower housing parts 10,20 and two end pieces 30,40, in the illustrated example serving as a housing for a device for adjusting the beam direction of a beam radiated from an antenna with an array of antenna elements coupled to the device, as explained in detail in the separate Swedish patent application entitled "Beam adjusting device" being filed simultaneously with the present application by the same applicant. The disclosure of the separate application is incorporated herein by reference.

It should be understood that the housing may be of any kind being used in electromagnetic applications where it is important that the housing parts are joined to each other in a well-defined manner, in particular so as to avoid inter-modulation products or similar disturbances. Thus, the housing may serve as a housing for a transmission line (strip line or microstrip), a wave-guide, a resonating cavity or some other electromagnetic device.

The housing parts 10 and 20 are formed by extrusion of a metal alloy, e.g. of aluminium, and the parts are subsequently coated with an insulating oxide layer in an electrolytic process. Therefore, in the illustrated example, these two parts will be coupled capacitively to each other upon assembly. Both parts 10,20 have side flanges along their longitudinal edges, the side flanges 12,13 and 22,23, respectively, being integrally joined to the respective top and bottom walls 11,21 at longitudinal edge portions 14,15 and 24,25 serving as resilient pivoting axes.

Before assembly, the above-mentioned adjustment device 50 (visible only in FIGS. 3–6) is mounted inside the lower housing part 20. Then, the upper and lower housing parts 10,20 are pressed together so that the end pieces 30,40 are fitted therebetween at the respective end portions of the housing, and the end pieces are tightly secured to the upper and lower parts by means of rivets 31,41. At the same time, the side flanges will be slightly bent so as make contact with each other and form the side walls of the housing. Thanks to the end pieces, a well-defined distance between the inner surfaces of the top and bottom walls 11,21 will be obtained.

The interaction of the side flanges will now be explained with reference to FIGS. 3–6. FIG. 3 shows the upper and lower parts having nominal measures. The distance D1 between the inside surfaces of the side flanges 12,13 of the upper part 10 is slightly smaller than the distance D2 between the outer surfaces of the side flanges 22,23. Therefore, when the parts are assembled, the side flanges 12,13 will be bent slightly outwards, and the side flanges 22,23 will be bent slightly inwards, so that the adjoining, mutually contacting side flanges 12,22 and 13,23, respectively, are somewhat inclined at a small angle v (see FIG. 6) in relation to a plane standing at right angle to the top and bottom walls 11,21.

Importantly, because of the geometrical configuration as shown in FIG. 3, the side flanges will exert a resilient pressure against each other over a large area of surface contact. This pressure will also contribute to holding the two housing parts together by friction. During and after assembly, the surface contact will be preserved even if the actual measures differ from the nominal values D1 and D2 within certain tolerance limits. In FIG. 4, one extreme case is shown, where D1' is a maximum value and D2' is a minimum value, whereas FIG. 5 shows the other extreme case, where D1" is a minimum value and D2" is a maximum value. In the case illustrated in FIG. 4, the angle v will be close to 0 degrees, whereas in the case illustrated in FIG. 5, the angle v will be twice as large as that shown in FIG. 6, e.g. about 4 degrees instead of about 2 degrees as in the nominal case. Generally, the angle v should be less than 10 degrees, preferably less than 5 degrees.

Advantageously, irrespective of the particular dimensions (within certain tolerance limits), a well-defined surface contact will be made between the adjacent side flanges 12,22 and 13,23, respectively.

Instead of a metal material, it is possible to use a plastic material being coated with an electrically conductive material.

In case the side flanges are made of a metal material coated with an insulating material, as in the preferred embodiment, the two surfaces will provide a high and well-defined capacitance because of the small distance between the metal surfaces and the relatively large surface areas. Accordingly the impedance will be very low, with an associated effective RF coupling between the two housing parts.

The insulating coating on the side flanges (and possibly on the entire housing parts) may also comprise a tape, a paint, a plastic film and/or the like.

Moreover, the end pieces 30,40 may be secured to the housing parts 10,20 by other fastening means, such as screws, tape or glue.

What is claimed is:

1. A shielded housing substantially consisting of an electrically conducting material and having a top wall (11), a bottom wall (21) and two side walls, said housing serving as a ground plane, at least for RF frequencies, and comprising an upper part (10) and a lower part (20) being fitted together, said upper part (10) being a unitary part including said top wall (11) and a first pair of side flanges (12,13) extending downwards from opposite edges (14,15) of said top wall, said lower part (20) being a unitary part including said bottom wall (21) and a second pair of aide flanges (22,23) extending upwards from opposite edges (24,25) of said bottom wall, said first and second pairs of side flanges are resiliently united with said top and bottom walls, respectively, and are dimensioned so that one of said pairs fits resiliently inside the other pair, and the mutually contacting side flanges exert a surface contact pressure against each other and jointly form said side walls upon being fitted together characterized in that said first and second pairs of side flanges stand at substantially right angles to said top and bottom walls, respectively, before being fitted together, whereas they are bent inwardly and outwardly, respectively, at an angle not, exceeding 5 degrees upon being fitted together, the nominal external measure of said one pair fitting inside the other pair is slightly greater than the nominal internal measure of said other pair, and said angle is between 0 degrees and an upper limit not exceeding 5 degrees depending on the actual measures resulting from manufacturing tolerances, the angle being half of the upper limit in case the actual measures coincide with the nominal measures.

2. The shielded housing defined in claim 1, wherein
the mutually contacting surface portions of said side flanges are coated with thin layers of an electrically insulating material so as to form a capacitive coupling therebetween.

3. The shielded housing defined in claim 1, wherein said upper and lower parts of said housing are made of a metallic material with an insulating coating.

4. The shielded housing defined in claim 3, wherein said insulating coating is an oxide layer.

5. The shielded housing defined in claim 4, wherein said metallic material is aluminium and said oxide layer is aluminium oxide.

6. The shielded housing defined in claim 1, wherein said upper limit of said angle is about 4 degrees.

7. The shielded housing defined in claim 1, wherein said side flanges (12,13,22,23) are resiliently pivotable in relation to said top and bottom walls (11,21), respectively.

8. The shielded housing defined in claim 1, wherein said top and bottom walls (11,21) of the housing are held at a predetermined distance from each other by means of two end pieces (30,40).

* * * * *